(12) United States Patent
Katsuki et al.

(10) Patent No.: US 12,232,306 B2
(45) Date of Patent: Feb. 18, 2025

(54) ELECTROMAGNETIC WAVE SHIELDING FILM AND SHIELDED PRINTED WIRING BOARD

(71) Applicant: TATSUTA ELECTRIC WIRE & CABLE CO., LTD., Higashiosaka (JP)

(72) Inventors: Takahiko Katsuki, Kizugawa (JP); Hiroshi Tajima, Kizugawa (JP); Sirou Yamauchi, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 6 days.

(21) Appl. No.: 18/553,148

(22) PCT Filed: Mar. 29, 2022

(86) PCT No.: PCT/JP2022/015253
§ 371 (c)(1),
(2) Date: Sep. 28, 2023

(87) PCT Pub. No.: WO2022/210631
PCT Pub. Date: Oct. 6, 2022

(65) Prior Publication Data
US 2024/0172405 A1    May 23, 2024

(30) Foreign Application Priority Data

Mar. 29, 2021   (JP) .................... 2021-054984

(51) Int. Cl.
*H05K 9/00* (2006.01)
*H05K 1/02* (2006.01)
(52) U.S. Cl.
CPC ......... *H05K 9/0086* (2013.01); *H05K 1/0218* (2013.01); *H05K 2201/0715* (2013.01)
(58) Field of Classification Search
CPC .................................................. H05K 9/0086
See application file for complete search history.

(56) References Cited

U.S. PATENT DOCUMENTS 10,820,457 B1 *  10/2020  Kishi ................ H05K 1/0227
2009/0126984 A1    5/2009  Saneto et al.
(Continued)

FOREIGN PATENT DOCUMENTS

CN       207124801 U     3/2018
JP       2008306177 A    12/2008
(Continued)

OTHER PUBLICATIONS

International Search Report dated Jun. 17, 2022, issued in connection with International Application PCT/JP2022/015253.
(Continued)

*Primary Examiner* — Hung V Ngo
(74) *Attorney, Agent, or Firm* — United IP Counselors, LLC; Kenneth M. Fagin

(57) ABSTRACT

An electromagnetic wave shielding film has permeability to volatile components, shielding characteristics, and resistance to folding. The electromagnetic wave shielding film includes an adhesive layer; a metal layer made of a metal and placed on the adhesive layer; and an insulating layer placed on the metal layer. Multiple openings are formed in the metal layer; the openings include openings (A) including island-shaped metal layer fragments, each opening (A) having island-shaped metal layer fragments formed therein, and the openings (A) including island-shaped metal layer fragments include openings (A1) including one or more island-shaped metal layer fragments. Each opening (A1) defines an opening (A) including island-shaped metal layer fragments in which a total area of the island-shaped metal layer fragments accounts for 40 to 80% of an area inside a contour of the opening (A).

14 Claims, 3 Drawing Sheets

(56) References Cited

U.S. PATENT DOCUMENTS

| | | | |
|---|---|---|---|
| 2012/0175164 A1 | 7/2012 | Saneto et al. | |
| 2016/0057900 A1* | 2/2016 | Polak | H01F 27/36 |
| | | | 156/60 |
| 2016/0120077 A1* | 4/2016 | Watanabe | H05K 9/0081 |
| | | | 174/377 |
| 2017/0002488 A1* | 1/2017 | Tanaka | H05K 9/0084 |
| 2021/0090794 A1* | 3/2021 | Woo | H01F 27/361 |
| 2022/0142022 A1* | 5/2022 | Su | H05K 9/0088 |
| | | | 174/388 |
| 2022/0151119 A1 | 5/2022 | Yanagi | |
| 2023/0155268 A1* | 5/2023 | Tanaka | H01P 1/24 |
| | | | 342/1 |
| 2023/0309283 A1* | 9/2023 | Chiba | H05K 9/0088 |

FOREIGN PATENT DOCUMENTS

| | | |
|---|---|---|
| JP | 2018060987 A | 4/2018 |
| TW | 201934697 A | 9/2019 |
| TW | 202100352 A | 1/2021 |
| TW | 202106514 A | 2/2021 |
| WO | 2016052225 A1 | 4/2016 |
| WO | 2018147298 A1 | 8/2018 |

OTHER PUBLICATIONS

Written Opinion dated Jun. 17, 2022, issued in connection with International Application PCT/JP2022/015253.

* cited by examiner

ELECTROMAGNETIC WAVE SHIELDING FILM AND SHIELDED PRINTED WIRING BOARD

TECHNICAL FIELD

The present invention relates to an electromagnetic wave shielding film and a shielded printed circuit board.

BACKGROUND ART

Conventionally, an electromagnetic wave shielding film, for example, is attached to a printed circuit board such as a flexible printed circuit board (FPC) to shield it from electromagnetic waves from outside.

Usually, an electromagnetic wave shielding film has a structure in which an electrically conductive adhesive layer, a shielding layer including a metal thin film or the like, and an insulating layer are layered in this order. A printed circuit board with such an electromagnetic wave shielding film superposed thereon is heat-pressed to attach the electromagnetic wave shielding film to the printed circuit board via the adhesive layer, thereby preparing a shielded printed circuit board. After such adhesion, components are mounted on the shielded printed circuit board by solder reflow. Meanwhile, the printed circuit board has a structure in which a printed pattern on a base film is covered with an insulating film.

When the shielded printed circuit board is heated by the heat-pressing or the solder reflow in production of the shielded printed circuit board, a gas is generated from the adhesive layer of the electromagnetic wave shielding film or the insulating film of the printed circuit board or the like. In a case where the base film of the printed circuit board is formed from a resin with high moisture absorbency, such as polyimide, water vapor may also be generated from the base film by heating. These volatile components generated from the adhesive layer, the insulating film, and the base film cannot pass through the shielding layer, and therefore gather between the shielding layer and the adhesive layer. Accordingly, if rapid heating is carried out in the solder reflow process, the interlayer adhesion between the shielding layer and the adhesion layer may be broken by the volatile components gathering between the shielding layer and the adhesive layer to deteriorate the shielding characteristics.

To solve such a problem, a plurality of openings are provided in the shielding layer (metal thin film) to improve gas permeability.

When the shielding layer has a plurality of openings, the volatile components can pass through the shielding layer via the openings even if the volatile components are generated. It is thus possible to prevent the volatile components from gathering between the shielding layer and the electrically conductive adhesive layer, so that it is possible to prevent the deterioration of the shielding characteristics due to the breakage of the interlayer adhesion.

As such an electromagnetic wave shielding film having openings in the shielding layer (metal layer), Patent Literature 1 discloses an electromagnetic wave shielding film including: an electrically conductive adhesive layer; a shielding layer placed on the electrically conductive adhesive layer; and an insulating layer placed on the shielding layer. In the electromagnetic wave shielding film, a plurality of openings are formed in the shielding layer, the opening area of the opening is 70 to 71000 μm$^2$, and the opening rate due to the openings is 0.05 to 3.6%.

Patent Literature 2 discloses an electromagnetic wave shielding sheet including: an insulating layer, a metal layer, and an electrically conductive adhesive layer. The metal layer has 100 to 200000 openings per square centimeter, each opening having an area of 0.7 to 5000 μm$^2$; and regarding the openings in the metal layer, the distance from the center point of an opening to the center point of the nearest opening and the number of the openings in the area of the metal layer are adjusted so as to be within the respective specific ranges.

CITATION LIST

Patent Literature

Patent Literature 1: WO 2018/147298A
Patent Literature 2: JP 2018-60987A

SUMMARY OF INVENTION

Technical Problem

In the electromagnetic wave shielding films (electromagnetic wave shielding sheets) disclosed in Patent Literatures 1 and 2, it is possible to prevent the volatile components from gathering between the shielding layer (metal layer) and the electronically conductive adhesive layer, so that it is possible to prevent the breakage of the interlayer adhesion. However, a problem of these electromagnetic wave shielding films (electromagnetic wave shielding sheets) is that the resistance thereof against folding is not sufficiently large.

In addition, another problem is that electromagnetic waves are likely to pass through the electromagnetic wave shielding film via the openings since the openings are formed in the shielding layer (metal layer). The shielding characteristics in, particularly, a high frequency region of 10 GHz or more may be not sufficient.

The present invention has been made to solve the above-described problems, and an object of the present invention is to provide an electromagnetic wave shielding film having both permeability to volatile components and shielding characteristics and also having sufficiently high resistance against folding.

Solution to Problem

The electromagnetic wave shielding film of the first aspect of the present invention is an electromagnetic wave shielding film including: an adhesive layer; a metal layer made of a metal and placed on the adhesive layer; and an insulating layer placed on the metal layer, wherein a plurality of openings are formed in the metal layer; the openings include openings (A) including one or more island-shaped metal layer fragments, wherein a plurality of openings are formed in the metal layer; the openings include openings (A) including one or more island-shaped metal layer fragments, each opening (A) having one or more island-shaped metal layer fragments formed therein, and the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside a contour of the opening (A).

In the electromagnetic wave shielding film of the first aspect of the present invention, the openings include openings (A) including one or more island-shaped metal layer fragments. The opening (A) including one or more island-shaped metal layer fragments is an opening inside which one or more island-shaped metal layer fragments are formed.

The "island-shaped metal layer fragments" herein means a metal layer fragment that is present inside the region surrounded by the contour of an opening and that is not in contact with the contour of the opening.

In the electromagnetic wave shielding film of the first aspect of the present invention, the openings may include an opening in which a contiguous metal layer fragment, which is in contact with the contour of an opening, is formed; however, such a contiguous metal layer fragment is not encompassed by the "island-shaped metal layer fragments".

Each island-shaped metal layer fragment is not connected to the contour of the opening, and is separated from the metal layer in which the openings are formed. Accordingly, if a force such as a pressure or a stress is applied to the island-shaped metal layer fragments, the force is unlikely to spread over the metal layer in which the openings are formed.

Thus, even if volatile components are generated between the metal layer and the adhesive layer and apply a pressure to the island-shaped metal layer fragments, the pressure is unlikely to spread over the metal layer in which the openings are formed.

Furthermore, the volatile components can pass through the metal layer via the openings.

Accordingly, in the electromagnetic wave shielding film of the first aspect of the present invention, it is possible to prevent the breakage of the interlayer adhesion between the metal layer and the adhesive layer due to the generation of the volatile components.

Generally, when electromagnetic waves reach an electromagnetic wave shielding film, the electromagnetic waves are reflected and absorbed by the metal layer of the electromagnetic wave shielding film. Due to such a mechanism, the electromagnetic waves are shielded by the electromagnetic wave shielding film.

When openings are formed in the metal layer of the electromagnetic wave shielding film, the electromagnetic waves may pass through the electromagnetic wave shielding film via the openings. The likelihood that the electromagnetic waves pass through depends on the size and the number of the openings.

In a case where island-shaped metal layer fragments are formed inside openings as in the electromagnetic wave shielding film of the first aspect of the present invention, such island-shaped metal layer fragments also function as the shielding layer for reflecting and absorbing electromagnetic waves. Namely, when the openings in the metal layer include openings (A) including one or more island-shaped metal layer fragments, the electromagnetic wave shielding film has better shielding characteristics as compared with a case where the insides of the openings in the metal layer are completely void.

In a case where island-shaped metal layer fragments are present inside openings as in the electromagnetic wave shielding film of the first aspect of the present invention, the metal layer is less likely to fold. The reason for this can be described as follows.

In a case where the openings include no island-shaped metal layer fragments formed therein and are thus completely void in the insides thereof, there are no substances in the openings that exhibit deformation resistance against the folding when the electromagnetic wave shielding film is folded. However, in a case where there are island-shaped metal layer fragments inside the openings as in the electromagnetic wave shielding film of the first aspect of the present invention, the stress is applied also to the island-shaped metal layer fragments when the electromagnetic wave shielding film is folded. The island-shaped metal layer fragments are made of a metal and exhibit deformation resistance, and therefore, the island-shaped metal layer fragments exhibit deformation resistance against the stress for folding the electromagnetic wave shielding film. As a result, it is unlikely that the metal layer is folded and broken.

For this reason, the electromagnetic wave shielding film of the first aspect of the present invention, which has the island-shaped metal layer fragments, has sufficiently high resistance against folding.

Additionally, in the electromagnetic wave shielding film of the first aspect of the present invention, the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

When the total of the areas of the one or more island-shaped metal layer fragments accounts for 40 to 80% of the area inside the contour of the opening (A) including one or more island-shaped metal layer fragments, the resistance against folding and the shielding characteristics are better.

If the total of the areas of the one or more island-shaped metal layer fragments accounts for less than 40% of the area inside the contour of the opening (A) including one or more island-shaped metal layer fragments, the one or more island-shaped metal layer fragments are small and therefore have low deformation resistance, and the electromagnetic wave shielding film tends to have low resistance against folding and also poor shielding characteristics.

If the total of the areas of the one or more island-shaped metal layer fragments accounts for more than 80% of the area inside the contour of the opening (A) including one or more island-shaped metal layer fragments, the pass for the volatile components is so narrow that breakage of the interlayer adhesion is likely to occur.

In the electromagnetic wave shielding film of the first aspect of the present invention, the percentage of the number of the openings (A) including one or more island-shaped metal layer fragments is preferably 25% or more based on the number of the openings.

When the number of the openings (A) including one or more island-shaped metal layer fragments is large, the effects brought about by forming the one or more island-shaped metal layer fragments are more easily exhibited, including the effect of preventing the breakage of the interlayer adhesion, the effect of improving the shielding characteristics, and the effect of improving the resistance against folding.

In the electromagnetic wave shielding film of the first aspect of the present invention, the percentage of the number of the openings (A1) including one or more island-shaped metal layer fragments is preferably 5% or more based on the number of the openings.

When the number of the openings (A1) including one or more island-shaped metal layer fragments is large, the effect is more easily exhibited that is brought when the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

Namely, the electromagnetic wave shielding film of the first aspect of the present invention has even higher resistance against folding and even better shielding characteristics.

The electromagnetic wave shielding film of the second aspect of the present invention is an electromagnetic wave shielding film including: an adhesive layer; a metal layer made of a metal and placed on the adhesive layer; and an insulating layer placed on the metal layer, wherein a plurality of openings are formed in the metal layer; the openings include openings (A) including one or more island-shaped metal layer fragments, each opening (A) having one or more island-shaped metal layer fragments formed therein, and a total of areas of the one or more island-shaped metal layer fragments in the whole metal layer accounts for 1 to 90% of a total of areas inside contours of the openings in the whole metal layer.

In the electromagnetic wave shielding film of the second aspect of the present invention, the openings include openings (A) including one or more island-shaped metal layer fragments, and the opening (A) including one or more island-shaped metal layer fragments is an opening inside which one or more island-shaped metal layer fragments are formed. Accordingly, the electromagnetic wave shielding film exhibits the effects brought about by forming the one or more island-shaped metal layer fragments, including the effect of preventing the breakage of the interlayer adhesion, the effect of improving the shielding characteristics, and the effect of improving the resistance against folding.

In the electromagnetic wave shielding film of the second aspect of the present invention, the openings may include an opening that includes a contiguous metal layer fragment, which is in contact with the contour of an opening; however such a contiguous metal layer fragment is not encompassed by the "island-shaped metal layer fragment".

In the electromagnetic wave shielding film of the second aspect of the present invention, the total of the areas of the one or more island-shaped metal layer fragments in the whole metal layer accounts for 1 to 90% of the total of the areas inside the contours of the openings in the whole metal layer.

When the total of the areas of the one or more island-shaped metal layer fragments in the whole metal layer accounts for 1 to 90% of the total of the areas inside the contours of the openings in the whole metal layer, the resistance against folding and the shielding characteristics are better.

If the total of the areas of the one or more island-shaped metal layer fragments in the whole metal layer accounts for less than 1% of the total of the areas inside the contours of the openings in the whole metal layer, this means that the number of the island-shaped metal layer fragments in the whole metal layer is small. In other words, this means that the number of the island-shaped metal layer fragments, which have deformation resistance, is small. Accordingly, the electromagnetic wave shielding film tends to have low resistance against folding and also poor shielding characteristics.

If the total of the areas of the one or more island-shaped metal layer fragments in the whole metal layer accounts for more than 90% of the total of the areas inside the contours of the openings in the whole metal layer, the pass for the volatile components is so narrow that breakage of the interlayer adhesion is likely to occur.

In the electromagnetic wave shielding film of the second aspect of the present invention, the openings (A) including one or more island-shaped metal layer fragments preferably include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

When the electromagnetic wave shielding film includes the openings (A1) including one or more island-shaped metal layer fragments, the electromagnetic wave shielding film has higher resistance against folding and better shielding characteristics.

If the total of the areas of the one or more island-shaped metal layer fragments accounts for less than 40% of the area inside the contour of the opening (A) including one or more island-shaped metal layer fragments, the one or more island-shaped metal layer fragments are small and therefore have low deformation resistance, and the electromagnetic wave shielding film tends to have low resistance against folding and also poor shielding characteristics.

If the total of the areas of the one or more island-shaped metal layer fragments accounts for more than 80% of the area inside the contour of the opening (A) including one or more island-shaped metal layer fragments, the pass for the volatile components is so narrow that breakage of the interlayer adhesion is likely to occur.

In the electromagnetic wave shielding film of the second aspect of the present invention, the percentage of the number of the openings (A1) including one or more island-shaped metal layer fragments is preferably 5% or more based on the number of the openings.

When the number of the openings (A1) including one or more island-shaped metal layer fragments is large, the effect is more easily exhibited that is brought when the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

Namely, the electromagnetic wave shielding film has even higher resistance against folding and even better shielding characteristics.

In the electromagnetic wave shielding film of the second aspect of the present invention, the percentage of the number of the openings (A) including one or more island-shaped metal layer fragments is preferably 25% or more based on the number of the openings.

When the number of the openings (A) including one or more island-shaped metal layer fragments is large, the effects brought about by forming the one or more island-shaped metal layer fragments are more easily exhibited, including the effect of preventing the breakage of the interlayer adhesion, the effect of improving the shielding characteristics, and the effect of improving the resistance against folding.

In the electromagnetic wave shielding film of the first aspect of the present invention and the electromagnetic wave shielding film of the second aspect of the present invention (hereinafter, the "electromagnetic wave shielding film of the present invention" as simply mentioned encompasses both aspects), the metal layer preferably has an opening rate of 5 to 90%.

If the opening rate due to the openings is less than 5%, the percentage of the openings is so low that it is difficult for the volatile components to pass through the metal layer. As a result, the volatile components are likely to gather between the metal layer and the adhesive layer. Thus, the interlayer adhesion between the metal layer and the adhesive layer tends to be broken by the volatile components.

If the opening rate due to the openings is more than 90%, the percentage of the openings is too large, and thus the metal layer has poor strength, resulting in poor resistance against folding.

The "opening rate" herein means the proportion of the total opening area of the plurality of the openings in the area of the whole main surface of the metal layer. When the "opening rate" is calculated, the areas of the island-shaped metal layer fragments are not included in the opening area.

In the electromagnetic wave shielding film of the present invention, the average area inside the contour of one of the openings is preferably 5 to 2000 $\mu m^2$.

If the average area inside the contour of one opening is less than 5 $\mu m^2$, the openings are so narrow that it is difficult for the volatile components to pass through the metal layer. As a result, the volatile components are likely to gather between the metal layer and the adhesive layer. Thus, the interlayer adhesion between the metal layer and the adhesive layer tends to be broken by the volatile components.

If the average area inside the contour of one opening is more than 2000 $\mu m^2$, the openings are too large, and thus the metal layer has poor strength, resulting in poor resistance against folding.

In the electromagnetic wave shielding film of the present invention, the metal layer preferably has a thickness of 0.4 to 1.9 $\mu m$.

If the metal layer has a thickness of less than 0.4 $\mu m$, the metal layer is so thin that the metal layer has poor strength, resulting in low resistance against folding. In addition, it is difficult for such a metal layer to sufficiently reflect and absorb electromagnetic waves, resulting in poor shielding characteristics.

If the metal layer has a thickness of more than 1.9 $\mu m$, the electromagnetic wave shielding film as a whole is thick and thus difficult to handle.

In the electromagnetic wave shielding film of the present invention, the metal layer preferably includes at least one metal selected from the group consisting of copper, silver, gold, aluminum, nickel, tin, palladium, chromium, titanium, or zinc.

The metal layer including any of these metals suitably functions as a shielding layer for shielding electromagnetic waves.

The electromagnetic wave shielding film of the present invention preferably has a water vapor transmission rate of 40 g or more per $m^2 \cdot 24$ h at a temperature of 80° C., a humidity of 95% RH, and a differential pressure of 1 atm, in accordance with JIS K 7129.

When the water vapor transmission rate is within such range, the volatile components are unlikely to gather between the metal layer and the adhesive layer, and thus, the interlayer adhesion between the metal layer and the adhesive layer is unlikely to be broken by the volatile components.

The shielded printed circuit board of the present invention is a shielded printed circuit board including: a printed circuit board including a base member having a printed circuit, and an insulating film provided on the base member to cover the printed circuit; and an electromagnetic wave shielding film provided on the printed circuit board, wherein the electromagnetic wave shielding film is the electromagnetic wave shielding film of the first aspect of the present invention or the electromagnetic wave shielding film of the second aspect of the present invention.

The shielded printed circuit board of the present invention includes the electromagnetic wave shielding film of the present invention described above.

Accordingly, interlayer peeling between the metal layer and the adhesive layer in the electromagnetic wave shielding film is unlikely to occur, resulting in better shielding characteristics. In addition, even if the electromagnetic wave shielding film is folded by folding the shielded printed circuit board, the electromagnetic wave shielding film is unlikely to be damaged.

Advantageous Effects of Invention

According to the present invention, there can be provided an electromagnetic wave shielding film having both permeability to volatile components and shielding characteristics and also having sufficiently high resistance against folding.

DESCRIPTION OF EMBODIMENTS

The electromagnetic wave shielding film of the present invention will be now specifically described. However, the present invention is not limited to the embodiments below, and can be applied with appropriate modification within the scope of the present invention without departing from the gist thereof.

First Embodiment

Figure 1A:
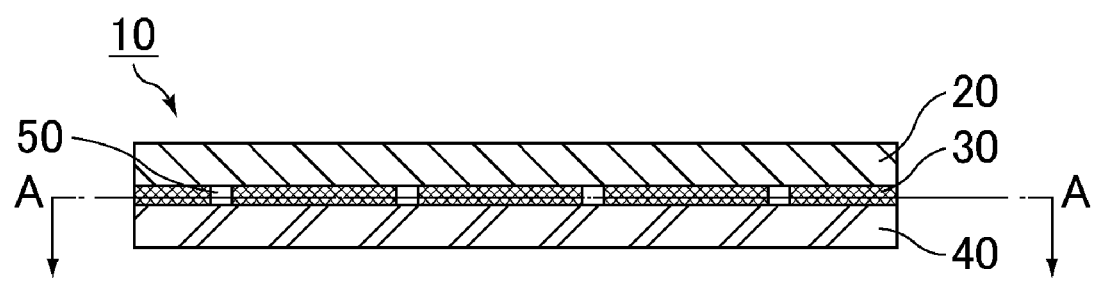
FIG. 1A is a cross-sectional view schematically showing one example of the electromagnetic wave shielding film according to the first embodiment of the present invention.
Figure 1B:
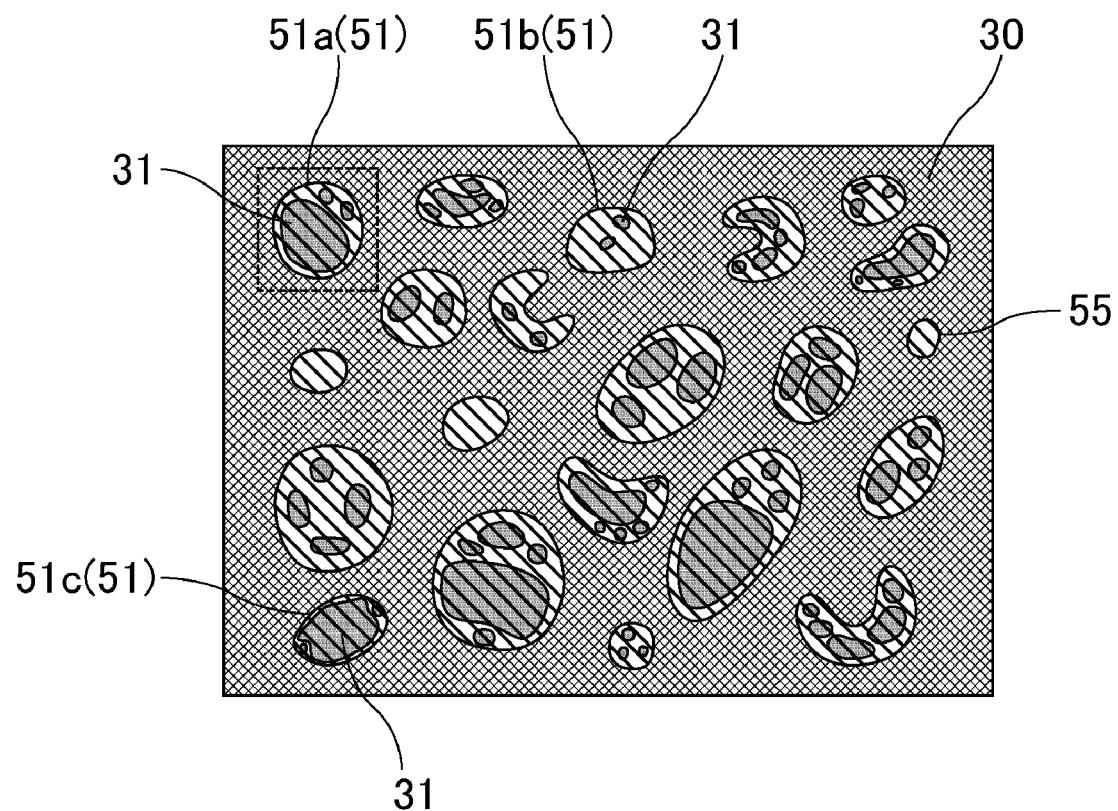
FIG. 1B is the cross-sectional view along line A-A in FIG. 1A.

FIG. 1A is a cross-sectional view schematically showing one example of the electromagnetic wave shielding film according to the first embodiment of the present invention. FIG. 1B is the cross-sectional view along line A-A in FIG. 1A.

As shown in FIG. 1A, an electromagnetic wave shielding film 10 is an electromagnetic wave shielding film including an insulating layer 20, a metal layer 30, and an adhesive layer 40 stacked in this order. In the metal layer 30, openings 50 are formed.

As shown in FIG. 1B, the openings 50 include openings (A) 51 including one or more island-shaped metal layer fragments, and the opening (A) 51 including one or more island-shaped metal layer fragments is the opening 50 inside which one or more island-shaped metal layer fragments 31 are formed.

Components of the electromagnetic wave shielding film 10 will be described in detail below.

(Metal Layer)

In the electromagnetic wave shielding film 10, the metal layer 30 functions as a shielding layer for shielding electromagnetic waves.

Each island-shaped metal layer fragment 31 is not connected to the contour of the opening 50, and is separated from the metal layer 30 in which the opening 50 is formed. Accordingly, even if a force such as a pressure or a stress is applied to an island-shaped metal layer fragment 31, the force is unlikely to spread over the metal layer 30 in which the opening 50 is formed.

Thus, even if volatile components are generated between the metal layer 30 and the adhesive layer 40 and apply a pressure to island-shaped metal layer fragments 31, the pressure is unlikely to spread over the metal layer 30 in which the openings 50 are formed.

Furthermore, the volatile components can pass through the metal layer 30 via the openings 50.

Accordingly, in the electromagnetic wave shielding film 10, it is possible to prevent the breakage of the interlayer adhesion between the metal layer 30 and the adhesive layer 40 due to the generation of the volatile components.

Generally, when electromagnetic waves reach an electromagnetic wave shielding film, the electromagnetic waves are reflected and absorbed by the metal layer of the electromagnetic wave shielding film. Due to such a mechanism, the electromagnetic waves are shielded by the electromagnetic wave shielding film.

When openings are formed in the metal layer of the electromagnetic wave shielding film, the electromagnetic waves may pass through the electromagnetic wave shielding film via the openings. The likelihood that the electromagnetic waves pass through depends on the size and the number of the openings.

In a case where island-shaped metal layer fragments 31 are formed inside the openings 50 as in the electromagnetic wave shielding film 10, such island-shaped metal layer fragments 31 also function as the shielding layer for reflecting and absorbing electromagnetic waves. Namely, when the openings 50 in the metal layer 30 include the openings (A) 51 including one or more island-shaped metal layer fragments, the electromagnetic wave shielding film has better shielding characteristics as compared with a case where the insides of the openings in the metal layer are completely void.

In a case where island-shaped metal layer fragments 31 are present inside the openings 50 as in the electromagnetic wave shielding film 10, the metal layer 30 is less likely to fold. The reason for this can be described as follows.

In a case where the openings include no island-shaped metal layer fragments formed therein and are thus completely void in the insides thereof, there are no substances in the openings that exhibit deformation resistance against the folding when the electromagnetic wave shielding film is folded. However, in a case where there are island-shaped metal layer fragments 31 inside the openings 50 as in the electromagnetic wave shielding film 10, the stress is applied also to island-shaped metal layer fragments 31 when the electromagnetic wave shielding film 10 is folded. The island-shaped metal layer fragments 31 are made of a metal and exhibit deformation resistance, and therefore, the island-shaped metal layer fragments 31 exhibit deformation resistance against the stress for folding the electromagnetic wave shielding film 10. As a result, it is unlikely that the metal layer 30 is folded and broken.

For this reason, the electromagnetic wave shielding film 10, which has the island-shaped metal layer fragments 31, has sufficiently high resistance against folding.

As shown in FIG. 1B, the openings (A) 51 including one or more island-shaped metal layer fragments include openings (A1) 51a including one or more island-shaped metal layer fragments, each opening (A1) 51a defining an opening (A) 51 including one or more island-shaped metal layer fragments in which a total area of the one or more island-shaped metal layer fragments 31 accounts for 40 to 80% of an area inside the contour of the opening (A) 51.

The area of the island-shaped metal layer fragment 31 and the area inside the contour of the opening (A) 51 including one or more island-shaped metal layer fragments will be described in more detail with reference to drawings.

Figure 1C:
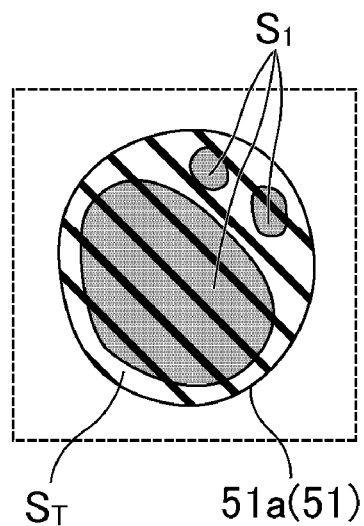
FIG. 1C is an enlarged view of the part shown in the dotted line in FIG. 1B.

FIG. 1C is an enlarged view of the part shown in the dotted line in FIG. 1B.

As shown in FIG. 1C, the area of the island-shaped metal layer fragment 31 means the area of the region designated by a reference sign $S_1$ in FIG. 1C.

As shown in FIG. 1C, the area inside the contour of the opening (A) 51 including one or more island-shaped metal layer fragments means the area of the region designated by a reference sign $S_T$ in FIG. 1C.

When there is a single island-shaped metal layer fragment 31 in the opening (A) 51 including one or more island-shaped metal layer fragments, the total of the areas $S_1$ of the one or more island-shaped metal layer fragments 31 in the opening (A) 51 including one or more island-shaped metal layer fragments means the area of the single island-shaped metal layer fragment 31. When there is a plurality of island-shaped metal layer fragments 31 in the opening (A) 51 including one or more island-shaped metal layer fragments, the total of the areas $S_1$ of the one or more island-shaped metal layer fragments 31 means the total of the areas of the plurality of island-shaped metal layer fragments 31.

In the opening (A1) 51a including one or more island-shaped metal layer fragments, the total of the areas $S_1$ preferably accounts for 45 to 75%, more preferably 50 to 60%, of the area $S_T$.

When the total of the areas $S_1$ accounts for 40 to 80% of the area $S_T$ in the opening (A1) 51a including one or more island-shaped metal layer fragments, the resistance against folding and the shielding characteristics are better.

If the total of the areas $S_1$ accounts for less than 40% of the area $S_T$, the island-shaped metal layer fragment is small and therefore has low deformation resistance, and the electromagnetic wave shielding film tends to have low resistance against folding, and also tends to have poor shielding characteristics.

If the total of the areas $S_1$ accounts for more than 80% of the area $S_T$, the pass for the volatile components is so narrow that breakage of the interlayer adhesion is likely to occur.

As shown in FIG. 1B, the electromagnetic wave shielding film 10 may include an island-shaped metal layer fragment-free opening 55, which is the opening 50 inside which no island-shaped metal layer fragments are formed.

The openings (A) 51 including one or more island-shaped metal layer fragments of the electromagnetic wave shielding film 10 may include openings (A2) 51b including one or more island-shaped metal layer fragments. The opening (A2) 51b including one or more island-shaped metal layer fragments is the opening (A) 51 including one or more island-shaped metal layer fragments in which the total of the areas $S_1$ of the one or more island-shaped metal layer fragments 31 accounts for less than 40% of the area $S_T$ inside the contour of the opening (A) 51 including one or more island-shaped metal layer fragments.

The openings (A) 51 including one or more island-shaped metal layer fragments of the electromagnetic wave shielding film 10 may include openings (A3) 51c including one or more island-shaped metal layer fragments, and the opening (A3) 51c including one or more island-shaped metal layer fragments is the opening (A) 51 including one or more island-shaped metal layer fragments in which the total of the areas $S_1$ of the one or more island-shaped metal layer fragments 31 accounts for more than 80% of the area $S_T$ inside the contour of the opening (A) 51 including one or more island-shaped metal layer fragments.

In the electromagnetic wave shielding film 10, the density of the openings 50 in the metal layer 30 is not limited, and is preferably 10 to 5000 openings/mm$^2$, more preferably 10 to 2000 openings/mm$^2$.

If the density of the openings in the metal layer is less than 10 openings/mm$^2$, the pass for the volatile components is so narrow that breakage of the interlayer adhesion is likely to occur.

If the density of the openings in the metal layer is more than 5000 openings/mm$^2$, the metal layer has poor strength so that the metal layer tends to be broken.

In the electromagnetic wave shielding film 10, the percentage of the number of the openings (A) 51 including one or more island-shaped metal layer fragments is preferably 25% or more, more preferably 30% or more, even more preferably 50% or more, based on the number of the openings 50.

When the number of the openings (A) 51 including one or more island-shaped metal layer fragments is large, the effects brought about by forming the one or more island-shaped metal layer fragments 31 are more easily exhibited, including the effect of preventing the breakage of the interlayer adhesion, the effect of improving the shielding characteristics, and the effect of improving the resistance against folding.

In the electromagnetic wave shielding film 10, the percentage of the number of the openings (A1) 51a including one or more island-shaped metal layer fragments is preferably 5% or more, more preferably 8% or more, based on the number of the openings 50.

When the number of the openings (A1) 51a including one or more island-shaped metal layer fragments is large, the effects brought about by including the openings (A1) 51a including one or more island-shaped metal layer fragments in which the total of the areas $S_1$ accounts for 40 to 80% of the area $S_T$ are more easily exhibited.

Namely, the electromagnetic wave shielding film 10 has even higher resistance against folding and even better shielding characteristics.

In the electromagnetic wave shielding film 10, the total of the areas $S_1$ of one or more island-shaped metal layer fragments 31 in the whole metal layer 30 preferably accounts for 1 to 90%, more preferably 10 to 75%, even more preferably 45 to 75%, particularly preferably 50 to 60%, of the total of the areas $S_T$ inside contours of the openings 50 in the whole metal layer 30.

When the total of the areas $S_1$ of one or more island-shaped metal layer fragments 31 in the whole metal layer 30 accounts for 1 to 90% of the total of the areas $S_T$ inside the contours of the openings 50 in the whole metal layer 30, the electromagnetic wave shielding film 10 has higher resistance against folding and better shielding characteristics.

If the total of the areas $S_1$ of one or more island-shaped metal layer fragments 31 in the whole metal layer 30 accounts for less than 1% of the total of the areas $S_T$ inside the contours of the openings 50 in the whole metal layer 30, this means that the number of the island-shaped metal layer fragments in the whole metal layer is small. In other words, this means that the number of the island-shaped metal layer fragments, which have deformation resistance, is small. Accordingly, the electromagnetic wave shielding film tends to have low resistance against folding and also poor shielding characteristics.

If the total of the areas $S_1$ of one or more island-shaped metal layer fragments 31 in the whole metal layer 30 accounts for more than 90% of the total of the areas $S_T$ inside the contours of the openings 50 in the whole metal layer 30, the pass for the volatile components is so narrow that breakage of the interlayer adhesion is likely to occur.

Herein, the areas $S_1$ of one or more island-shaped metal layer fragments 31 and the areas $S_T$ inside the contours of the openings 50 means the values determined by the following method.

First, an image of the metal layer is acquired using a scanning electron microscope (SEM). Next, the acquired image is binarized into white and black corresponding to the island-shaped metal layer fragment 31 parts and the void parts of the openings 50, respectively, using image analysis software "GIMP2.10.6". Then, the areas $S_1$ of one or more island-shaped metal layer fragments 31 and the areas $S_T$ inside the contours of the openings 50 are calculated from the numbers of pixels of the island-shaped metal layer fragment 31 parts and the void parts of the openings 50, respectively.

In the electromagnetic wave shielding film 10, the metal layer 30 preferably has an opening rate of 5 to 90%, more preferably 30 to 90%, even more preferably 40 to 80%, furthermore preferably 40 to 60%.

If the opening rate due to the openings is less than 5%, the percentage of the openings is so low that it is difficult for the volatile components to pass through the metal layer. As a result, the volatile components are likely to gather between the metal layer and the adhesive layer. Thus, the interlayer adhesion between the metal layer and the adhesion layer tends to be broken by the volatile components.

If the opening rate due to the openings is more than 90%, the percentage of the openings is too large, and thus the metal layer has poor strength, so that the electromagnetic wave shielding film has poor resistance against folding.

The "opening rate" herein means the proportion of the total opening area of a plurality of the openings 50 in the area of the whole main surface of the metal layer 30. When the "opening rate" is calculated, the island-shaped metal layer fragment 31 parts are not included in the opening area.

In the electromagnetic wave shielding film of the present invention, the average area inside the contour of one of the openings is preferably 5 to 2000 μm$^2$, more preferably 50 to 1800 μm$^2$.

If the average area inside the contour of one opening is less than 5 μm$^2$, the openings are so narrow that it is difficult for the volatile components to pass through the metal layer. As a result, the volatile components are likely to gather between the metal layer and the adhesive layer. Thus, the interlayer adhesion between the metal layer and the adhesive layer tends to be broken by the volatile components.

If the average area inside the contour of one opening is more than 2000 μm$^2$, the openings are too large, and thus the metal layer has poor strength, so that the electromagnetic wave shielding film tends to have poor resistance against folding.

In the electromagnetic wave shielding film of the present invention, the shape of the opening is not limited, and may be a circle, oval, racetrack, triangle, square, pentagon, hexagon, octagon, or star, for example.

In the electromagnetic wave shielding film of the present invention, the opening may have a shape in which a contiguous metal layer fragment, which is in contact with the contour of the opening, is formed. Such a contiguous metal layer fragment is not encompassed by the "island-shaped metal layer fragments" in the electromagnetic wave shielding film of the present invention.

The shapes of the plurality of the openings may be the same or different from each other.

In the electromagnetic wave shielding film 10, the metal layer 30 preferably has a thickness of 0.4 to 1.9 µm, more preferably 0.5 to 1.8 µm, even more preferably 0.8 to 1.5 µm.

When the metal layer 30 has a thickness of 0.4 to 1.9 µm, the transmitting property is favorable in a signal transmission system for transmitting high frequency signals having a frequency of 0.01 to 10 GHz.

If the metal layer has a thickness of less than 0.4 µm, the metal layer is so thin that the metal layer has poor strength and thus has poor resistance against folding. In addition, it is difficult for such a metal layer to sufficiently reflect and absorb the electromagnetic waves, and accordingly, the electromagnetic wave shielding film has poor shielding characteristics.

If the metal layer has a thickness of more than 1.9 µm, the electromagnetic wave shielding film as a whole is thick and thus difficult to handle.

In the electromagnetic wave shielding film 10, the metal layer 30 preferably includes at least one metal selected from the group consisting of copper, silver, gold, aluminum, nickel, tin, palladium, chromium, titanium, or zinc. The metal layer may include an alloy of these metals.

The metal layer is more preferably made of copper among these metals.

The metal layer 30 including any of these metals suitably functions as a shielding layer for shielding electromagnetic waves.

(Adhesive Layer)

In the electromagnetic wave shielding film 10, the adhesive layer 40 may have the electrical conductivity or may not have the electrical conductivity, and preferably has the electrical conductivity.

First, the case where the adhesive layer 40 has the electrical conductivity will be described.

In the case where the adhesive layer 40 has the electrical conductivity, the adhesive layer 40 is preferably composed of an electrically conductive particle and an adhesive resin composition.

The electrically conductive particle is not limited, and may be a metal fine particle, a carbon nanotube, a carbon fiber, a metal fiber, or the like.

In the case where the electrically conductive particle is a metal fine particle, the metal fine particle is not limited, and may be silver powder, copper powder, nickel powder, solder powder, aluminum powder, silver-coated copper powder obtained by plating copper powder with silver, or a fine particle obtained by coating a polymer fine particle or glass bead with a metal, for example.

Among these, copper powder or silver-coated copper powder, which is inexpensive, is preferable from an economical viewpoint.

The average particle size of the electrically conductive particle is not limited, and is preferably 0.5 to 15.0 µm.

When the average particle size of the electrically conductive particle is 0.5 µm or more, the electrical conductivity of the adhesive layer is better.

When the average particle size of the electrically conductive particle is 15.0 µm or less, the adhesive layer can be thin.

The shape of the electrically conductive particle is not limited, and may be appropriately selected from spherical, flattened, scaly, dendritic, rod-shaped, or fibrous shapes, for example.

The materials of the adhesive resin composition is not limited, and the adhesive resin composition used may be, for example, a thermoplastic resin composition such as a styrene resin composition, a vinyl acetate resin composition, a polyester resin composition, a polyethylene resin composition, a polypropylene resin composition, an imide resin composition, an amide resin composition, or an acrylic resin compositions; or a thermosetting resin composition such as a phenolic resin composition, an epoxy resin composition, a urethane resin composition, a melamine resin composition, or an alkyd resin composition.

The material for the adhesive resin composition may be any one of these, or a combination of two or more thereof.

The content of the electrically conductive particle in the adhesive layer 40 is not limited, and is preferably 15 to 80 wt % more preferably 15 to 60 wt %.

When the content is within the above-described range, the adhesive layer 40 has improved adhesion to a printed circuit board.

The thickness of the adhesive layer 40 is not limited and can be set appropriately according to the need, and the thickness is preferably 0.5 to 20.0 µm.

If the thickness of the adhesive layer is less than 0.5 µm, there is a tendency that good electrical conductivity cannot be obtained.

If the thickness of the adhesive layer is more than 20.0 µm, the thickness of the electromagnetic wave shielding film as a whole is so thick that it is difficult to handle the electromagnetic wave shielding film.

The adhesive layer 40 may have anisotropic electrical conductivity, or may have isotropic electrical conductivity, and it preferably has anisotropic electrical conductivity.

In the case where the adhesive layer 40 has anisotropic electrical conductivity, the property of transmitting high frequency signals in the signal circuit of a printed circuit board is improved as compared with the case where the adhesive layer 40 has isotropic electrical conductivity.

The anisotropic electrical conductivity can be imparted to the adhesive layer 40 by setting the content of the electrically conductive particle in the adhesive layer 40 within 2 to 40 wt %.

The isotropic electrical conductivity can be imparted to the adhesive layer 40 by setting the content of the electrically conductive particle in the adhesive layer 40 within a range from more than 40 wt % to not more than 80 wt %.

Next, the case where the adhesive layer 40 has no electrical conductivity will be described.

In the case where the adhesive layer 40 has no electrical conductivity, the adhesive layer 40 is preferably composed of an adhesive resin composition.

Preferred materials for the adhesive resin composition are the same as the preferred materials for the adhesive resin composition for the case where the adhesive layer 40 has electrical conductivity as described above.

Whether or not the adhesive layer 40 has electrical conductivity, the adhesive layer 40 may include, for example, a curing accelerator, a tackifier, an antioxidant, a pigment, a dye, a plasticizer, a UV absorber, a defoaming agent, a leveling agent, a filler, a flame retardant, and a viscosity modifier, if necessary.

(Insulating Layer)

In the electromagnetic wave shielding film 10, the insulating layer 20 is not limited as long as it has a sufficient insulating property and can protect the metal layer 30 and the adhesive layer 40, and the insulating layer 20 is preferably made of a thermoplastic resin composition, a thermosetting resin composition, or an active energy ray-curable composition, for example.

Examples of the thermoplastic resin composition include, but not limited to, a styrene resin composition, a vinyl acetate resin composition, a polyester resin composition, a polyethylene resin composition, a polypropylene resin composition, an imide resin composition, and an acrylic resin composition.

Examples of the thermosetting resin composition include, but not limited to, a phenolic resin composition, an epoxy resin composition, a urethane resin composition, a melamine resin composition, and an alkyd resin composition.

Examples of the active energy ray-curable composition include, but not limited to, a polymerizable compound having at least two (meth)acryloyloxy groups in its molecule.

The insulating layer 20 may be made of a single material or two or more materials.

The insulating layer 20 may include, for example, a curing accelerator, a tackifier, an antioxidant, a pigment, a dye, a plasticizer, a UV absorber, a defoaming agent, a leveling agent, a filler, a flame retardant, a viscosity modifier, and an antiblocking agent, if necessary.

The thickness of the insulating layer 20 is not limited and can be set appropriately according to the need, and the thickness is preferably 1 to 15 μm more preferably 3 to 10 μm.

If the thickness of the insulating layer 20 is less than 1 μm, the insulating layer 20 is so thin that it is difficult to protect the metal layer 30 and the adhesive layer 40 sufficiently.

If the thickness of the insulating layer 20 is more than 15 μm, the insulating layer 20 is so thick that it is difficult for the electromagnetic wave shielding film 10 to fold and also that the insulating layer 20 itself tends to be broken. Accordingly, it is difficult to apply the electromagnetic wave shielding film to a member which is desired to have the resistance against folding.

(Other Components)

In the electromagnetic wave shielding film 10, an anchor coat layer may be formed between the insulating layer 20 and the metal layer 30.

Examples of a material for the anchor coat layer include a urethane resin, an acrylic resin, a core/shell type composite resin having a urethane resin as the shell and an acrylic resin as the core, an epoxy resin, an imide resin, an amide resin, a melamine resin, a phenol resin, a urea-formaldehyde resin, a blocked isocyanate obtained by reacting a polyisocyanate with a blocking agent such as phenol, a polyvinyl alcohol, and polyvinylpyrrolidone.

The electromagnetic wave shielding film 10 may have a support film on the insulating layer 20 side, and may have a releasing film on the adhesive layer 40 side.

In the case where the electromagnetic wave shielding film 10 has the support film and/or the releasing film, it is easy to handle the electromagnetic wave shielding film 10 in the transport of the electromagnetic wave shielding film 10 and in the operation when a shielded printed circuit board or the like is produced by using the electromagnetic wave shielding film 10.

Such a support film and a releasing film are to be released when the electromagnetic wave shielding film 10 is disposed in a printed circuit board or the like.

The electromagnetic wave shielding film 10 preferably has a water vapor transmission rate of 40 g or more per $m^2 \cdot 24$ h, more preferably 200 g or more per $m^2 \cdot 24$ h, at a temperature of 80° C., a humidity of 95% RH, and a differential pressure of 1 atm, in accordance with JIS K 7129.

When the electromagnetic wave shielding film 10 has such a parameter, the volatile components are likely to pass through the metal layer, and as a result, it is difficult for the volatile components to gather between the metal layer and the adhesive layer. Accordingly, the interlayer adhesion between the metal layer and the adhesive layer is unlikely to be broken by the volatile components.

The electromagnetic wave shielding film of the present invention can be used for any application as long as it is used for the purpose of shielding electromagnetic waves.

The electromagnetic wave shielding film of the present invention is particularly preferably used for a printed circuit board, and especially, a flexible printed circuit board.

As described above, volatile components are unlikely to gather between the shielding layer and the adhesive layer in the electromagnetic wave shielding film of the present invention when a shielded printed circuit board is produced. In addition, the electromagnetic wave shielding film of the present invention has sufficient resistance against folding. Accordingly, even when the electromagnetic wave shielding film of the present invention is used for a flexible printed circuit board and folded repeatedly, the electromagnetic wave shielding film is unlikely to be broken.

Thus, the electromagnetic wave shielding film of the present invention can be suitably used as an electromagnetic wave shielding film for a flexible printed circuit board.

In such a case, the electromagnetic wave shielding film 10 is preferably used in a signal transmission system for transmitting signals having a frequency of 0.01 to 10 GHz.

Next, an example of the method for producing the electromagnetic wave shielding film of the present invention will be described.

In the method for producing the electromagnetic wave shielding film of the present invention, an insulating layer is first provided, and on one side of the insulating layer, a metal layer is formed.

As for the method for forming the metal layer, the metal layer may be formed by disposing metal foil, plating such as electrolytic plating or non-electrolytic plating, deposition, or printing.

These methods can be carried out by conventional known methods.

Next, openings are formed in the metal layer. At that time, openings (A) including one or more island-shaped metal layer fragments are formed. Each opening (A) is an opening inside which one or more island-shaped metal layer fragments are formed.

Furthermore, as at least one of the openings (A) including one or more island-shaped metal layer fragments, an opening (A1) including one or more island-shaped metal layer fragments is formed, the opening (A1) defining an opening (A) including one or more island-shaped metal layer fragments in which a total of areas of the one or more island-shaped metal layer fragments accounts for 40 to 80% of the area inside the contour of the opening (A).

The method for forming the openings is not limited, and examples thereof include a method including forming a resist on the metal layer and etching it, and a method including irradiating the metal layer with laser.

In the case where metal foil is disposed as the metal layer, the metal foil may be composed of a sparingly soluble component that has poor solubility to an etchant and an easily soluble component that has a higher solubility to the etchant than the sparingly soluble component.

In this case, the metal foil may be immersed in the etchant to dissolve the easily soluble component to thereby form openings at the positions where the easily soluble component has been present.

The ratio of the easily soluble component, the composition of the etchant, the etching conditions, and the like are adjusted, whereby opening (A1) including one or more island-shaped metal layer fragments can be formed, each opening (A1) defining an opening (A) including one or more island-shaped metal layer fragments in which a total of areas of the one or more island-shaped metal layer fragments accounts for 40 to 80% of the area inside the contour of the opening (A).

In this case, the sparingly soluble component and the easily soluble component in a combination may be copper and copper oxide, respectively.

As such metal foil, preferred is rolled copper foil of tough-pitch copper composed of copper oxide(I) and pure copper having a copper purity of 99.9 wt % or more, in which copper oxide and pure copper correspond to the easily soluble component and the sparingly soluble component, respectively. Alternatively to the tough-pitch copper, those containing copper oxide can be used, including HA foil (manufactured by JX Nippon Mining & Metals Corporation). Etching rolled copper foil can provide copper foil having a desired thickness, so that the thickness of the metal thin film can be accurate, and the resultant can be suitably used for an electromagnetic wave shielding film.

In the case where the metal layer is formed by plating or printing, the metal layer can be formed in advance such that openings and island-shaped metal layer fragments are formed, whereby the separate step of forming openings can be eliminated.

Thereafter, on the metal layer in which openings (A1) including one or more island-shaped metal layer fragments are formed, an adhesive layer is formed.

Through the above steps, the electromagnetic wave shielding film can be prepared.

In the above-described steps, the metal layer can be formed on one side of an electrically conductive adhesive layer, instead of the insulating layer, and an insulating layer can be formed on the metal layer that includes openings (A1) including one or more island-shaped metal layer fragments formed in the same manner as described above, to thereby prepare an electromagnetic wave shielding film.

Alternatively, an electromagnetic wave shielding film may be prepared in the following manner: openings (A1) including one or more island-shaped metal layer fragments are formed in the same manner as described above on copper foil placed on carrier copper foil, instead of an insulating layer; an insulating layer or an electrically conductive adhesive layer is attached thereto; and the carrier copper foil is peeled.

The electromagnetic wave shielding film of the present invention is disposed on a printed circuit board and thus serves as a part of a shielded printed circuit board. Such a shielded printed circuit board will be described.

The shielded printed circuit board including the electromagnetic wave shielding film of the present invention is also an aspect of the present invention.

Figure 2:
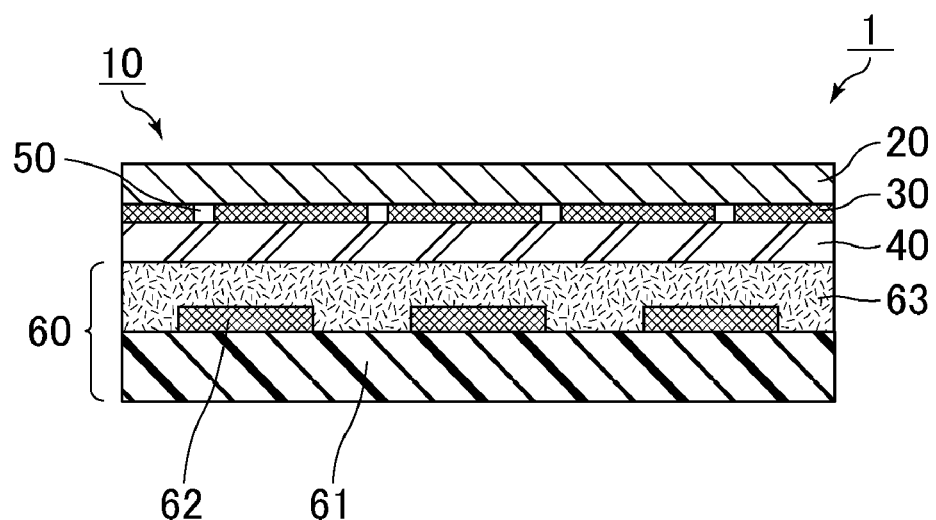
FIG. 2 is a cross-sectional view schematically showing one example of the shielded printed circuit board of the present invention.

FIG. 2 is a cross-sectional view schematically showing one example of the shielded printed circuit board of the present invention.

A shielded printed circuit board 1 shown in FIG. 2 includes: a printed circuit board 60 having a base member 61 with a printed circuit 62 formed thereon and an insulating film 63 provided on the base member 61 so as to cover the printed circuit 62; and the electromagnetic wave shielding film 10 provided on the printed circuit board 60.

In the shielded printed circuit board 1, the adhesive layer 40 of the electromagnetic wave shielding film 10 is in contact with the insulating film 63 of the printed circuit board.

The shielded printed circuit board 1 includes the electromagnetic wave shielding film 10.

Accordingly, peeling is unlikely to be caused at the interlayer between the metal layer 30 and the adhesive layer 40 of the electromagnetic wave shielding film 10, resulting in better shielding characteristics. In addition, even if the electromagnetic wave shielding film 10 is folded by folding the shielded printed circuit board 1, the electromagnetic wave shielding film 10 is unlikely to break.

The printed circuit 62 may include a ground circuit while the adhesive layer 40 of the electromagnetic wave shielding film 10 is electrically conductive. In such a case, an opening may be formed in the insulating film 63 to expose the ground circuit, so that the adhesive layer 40 may be in contact with the ground circuit.

Such a configuration enables electrical connection of the metal layer 30 as a shielding layer to the ground circuit, whereby shielding characteristics are improved.

Both the base member 61 and the insulating film 63 are each preferably made of an engineering plastic material. Examples thereof include resins such as polypropylene, crosslinked polyethylene, polyester, polybenzimidazole, polyimide, polyimideamide, polyetherimide, and polyphenylene sulfide (PPS).

For the printed circuit 62, any common material for circuits, such as copper, can be used.

The base member 61 and the printed circuit 62 may be bonded to each other with an adhesive, or may be joined without any adhesive, as with a so-called adhesive-free copper clad laminate. The insulating film 63 may be a product obtained by bonding a plurality of flexible insulating films to each other with an adhesive, or may be formed by a series of steps of coating, drying, exposing with light, developing, and heat-treatment of a photosensitive insulating resin.

Second Embodiment

The electromagnetic wave shielding film according to the second embodiment of the present invention is an electromagnetic wave shielding film including: an adhesive layer; a metal layer made of a metal and placed on the adhesive layer; and an insulating layer placed on the metal layer, wherein the openings include openings (A) including one or more island-shaped metal layer fragments, each opening (A) having one or more island-shaped metal layer fragments formed therein, and a total of areas of the one or more island-shaped metal layer fragments in the whole metal layer accounts for 1 to 90% of a total of areas inside contours of the openings in the whole metal layer.

For the electromagnetic wave shielding film according to the first embodiment of the present invention, it is an essential constitutional requirement to include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

However, for the electromagnetic wave shielding film according to the second embodiment of the present invention, this constitutional requirement is not essential, and it is an essential constitutional requirement that the total of the areas of the one or more island-shaped metal layer fragments in the whole metal layer accounts for 1 to 90% of the total of the areas inside contours of the openings in the whole metal layer. In the electromagnetic wave shielding film according to the second embodiment of the present invention, the total of the areas of the one or more island-shaped metal layer fragments in the whole metal layer preferably accounts for 10 to 75%, more preferably 45 to 75%, particularly preferably 50 to 60%, of the total of the areas inside contours of the openings in the whole metal layer.

When the total of the areas of the one or more island-shaped metal layer fragments in the whole metal layer accounts for 1 to 90% of the total of the areas inside contours of the openings in the whole metal layer, the resistance against folding and the shielding characteristics are better.

If the total of the areas of the one or more island-shaped metal layer fragments in the whole metal layer accounts for less than 1% of the total of the areas inside the contours of the openings in the whole metal layer, this means that the number of the island-shaped metal layer fragments in the whole metal layer is small. In other words, this means that the number of the island-shaped metal layer fragments, which have deformation resistance, is small. Accordingly, the resistance against folding of the electromagnetic wave shielding film is likely to be poor, and shielding characteristics also tend to be poor.

If the total of the areas of the one or more island-shaped metal layer fragments in the whole metal layer accounts for more than 90% of the total of the areas inside the contours of the openings in the whole metal layer, the pass for the volatile components is so narrow that breakage of the interlayer adhesion is likely to occur.

The electromagnetic wave shielding film of the second embodiment preferably includes openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

When the electromagnetic wave shielding film according to the second embodiment of the present invention includes the openings (A1) including one or more island-shaped metal layer fragments, the resistance against folding and the shielding characteristics are better.

In the electromagnetic wave shielding film of the present invention, the percentage of the number of the openings (A) including one or more island-shaped metal layer fragments is preferably 25% or more based on the number of the openings.

When the number of the openings (A) including one or more island-shaped metal layer fragments is large, the effects brought about by forming the one or more island-shaped metal layer fragments are more easily exhibited, including the effect of preventing the breakage of the interlayer adhesion, the effect of improving the shielding characteristics, and the effect of improving the resistance against folding.

In the electromagnetic wave shielding film according to the second embodiment of the present invention, the percentage of the number of the openings (A1) including one or more island-shaped metal layer fragments is preferably 5% or more, more preferably 8% or more, based on the number of the openings.

When the number of the openings (A1) including one or more island-shaped metal layer fragments is large, the effect is more easily exhibited that is brought when the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside the contour of the opening (A).

Namely, the resistance against folding and shielding characteristics of the electromagnetic wave shielding film of the second embodiment of the present invention are even better.

The preferred materials, components, and the others of the adhesion layer and the metal layer of the electromagnetic wave shielding film according to the first embodiment of the present invention are also applied to the preferred materials components, and the others of the adhesion layer and the metal layer of the electromagnetic wave shielding film according to the second embodiment of the present invention.

EXAMPLES

Examples for illustrating the present invention more specifically will be given below, but the present invention is not limited to these examples.

Example 1

An insulating layer made of an epoxy resin and having a thickness of 5 μm was provided.

On the insulating layer, copper foil having a thickness of 3 μm and including copper oxide(I) particles was then disposed.

Thereafter, etching treatment was carried out on the rolled copper foil to adjust the thickness thereof to 1 μm, whereby copper oxide(I) in the copper foil was dissolved to form openings.

An image of the rolled copper foil after etching was acquired by a SEM, and analyzed. As a result, it was found that the openings included openings (A) including one or more island-shaped metal layer fragments, each of which was an opening inside which one or more island-shaped metal layer fragments were formed; and that the openings (A) including one or more island-shaped metal layer fragments included openings (A1) including one or more island-shaped metal layer fragments, each of which was an opening (A) including one or more island-shaped metal layer fragments in which the total of the areas of the one or more island-shaped metal layer fragments accounted for 40 to 80% of the area inside the contour of the opening (A).

The percentage of the number of the openings (A1) including one or more island-shaped metal layer fragments was 5% based on the number of the openings. The opening rate due to the openings was 7.5%.

In the rolled copper foil, the percentage of the total of the areas of the island-shaped metal layer fragments in an opening (A) including one or more island-shaped metal layer fragments in the area inside the contour of the opening (A) was calculated, and the average thereof in the whole was calculated and found to be 51%.

Then, the rolled copper foil after etching was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Example 1 was prepared.

(Example 2) and (Example 3)

The electromagnetic wave shielding films according to Examples 2 and 3 were prepared in the same manner as in Example 1, except that the etching time was adjusted to change the percentage of the number of the openings (A1) including one or more island-shaped metal layer fragments in the number of the openings and the opening rate due to the openings to those shown in Table 1.

In the electromagnetic wave shielding film according to Example 2, the percentage of the total of the areas of the island-shaped metal layer fragments in an opening (A) including one or more island-shaped metal layer fragments in the area inside the contour of the opening (A) was calculated, and the average thereof in the whole was calculated and found to be 54%.

In the electromagnetic wave shielding film according to Example 3, the percentage of the total of the areas of the island-shaped metal layer fragments in an opening (A) including one or more island-shaped metal layer fragments in the area inside the contour of the opening (A) was calculated, and the average thereof in the whole was calculated and found to be 41%.

Comparative Example 1

An insulating layer made of an epoxy resin and having a thickness of 5 μm was provided.

Then, to one main surface of the insulating layer, a silver paste was applied by printing so as to form a plurality of openings having an opening area of 75 μm$^2$ at opening intervals of 250 μm in an opening rate of 0.14%, so that a silver layer of 50 nm was formed. The silver paste can be prepared by dispersing silver particles having an average particle size of 30 nm in a mixed solvent of 35 parts by mass of ethanol and 65 parts by mass of deionized water to a silver concentration of 15 wt % with a polyethylenimine compound as a dispersant.

Next, the insulating layer after the printing with the silver paste was immersed in an electroless copper plating solution ("AGR copper", pH 12.5, manufactured by OKUNO CHEMICAL INDUSTRIES CO., LTD.) at 55° C. for 20 minutes to form an electroless copper plating film (thickness 0.5 μm) on the silver layer.

Then, the surface of the electroless copper plating film obtained above was set on a cathode, and phosphorus-containing copper was set on an anode. Electroplating was carried out with an electroplating solution containing copper sulfate at a current density of 2.5 A/dm$^2$ for 30 minutes to thereby laminate the silver layer with a copper plating layer having a total thickness of 1 μm. As the above electroplating solution, a solution was used that contained 70 g/L of copper sulfate, 200 g/L of sulfuric acid, 50 mg/L of chloride ions, and 5 g/L of TOP LUCINA SF (glossing agent, manufactured by OKUNO CHEMICAL INDUSTRIES CO., LTD.).

The formed copper plate layer was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Comparative Example 1 was prepared.

Comparative Example 2

Etching treatment was carried out on rolled copper foil of tough-pitch copper having a thickness of 6 μm (manufactured by JX Nippon Mining & Metals Corporation) to adjust the thickness thereof to 2 μm.

As the etchant, a solution was used that was obtained by adding 8.5 vol % of concentrated sulfuric acid (98%) and 4.5 vol % of hydrogen peroxide solution (35%) to 25.0 g/L $CuSO_4 \cdot 5H_2O$. In this manner, copper oxide(I) in the rolled copper foil was dissolved to form openings, and then, the resulting rolled copper foil was washed.

An image of the rolled copper foil after washing was acquired by a SEM, and analyzed. As a result, any opening (A) including one or more island-shaped metal layer fragments, which was an opening inside which one or more island-shaped metal layer fragments were formed, was not found.

The opening rate due to the openings was 1.4%.

Next, the rolled copper foil including openings was disposed on an insulating layer made of an epoxy resin and having a thickness of 5 μm.

Then, the rolled copper foil was coated with a phosphorus-containing epoxy resin containing 20 wt % of Ag-coated Cu powder to form an adhesive layer having electrical conductivity and a thickness of 15 μm. For the coating method, the lip coat technique was used.

Through the above-described steps, the electromagnetic wave shielding film according to Comparative Example 2 was prepared.

(Comparative Example 3) to (Comparative Example 5)

The electromagnetic wave shielding films according to Examples 3 to 5 were prepared in the same manner as in Example 1, except that the etching time was adjusted to regulate the percentage of the areas of island-shaped metal layer fragments in openings (A) including one or more island-shaped metal layer fragments to thereby form no openings (A1) including one or more island-shaped metal layer fragments, and also to regulate the opening rate due to the openings to that shown in Table 1.

In Comparative Example 3 and Comparative Example 4, openings (A) including one or more island-shaped metal layer fragments were found; however, the maximum was less than 10%, among the percentages of the total of the areas of one or more island-shaped metal layer fragments in an opening (A) including one or more island-shaped metal layer fragments in the area inside the contour of the opening (A).

In Comparative Example 5, openings (A) including one or more island-shaped metal layer fragments were found; however, the minimum was more than 80%, among the percentages of the total of the areas of one or more island-shaped metal layer fragments in an opening (A) including one or more island-shaped metal layer fragments in the area inside the contour of the opening (A).

TABLE 1

|  | Ex. 1 | Ex. 2 | Ex. 3 | Comp Ex. 1 | Comp Ex. 2 | Comp Ex. 3 | Comp Ex. 4 | Comp Ex. 5 |
|---|---|---|---|---|---|---|---|---|
| Method for forming metal layer | Etching | Etching | Etching | Plating | Etching | Etching | Etching | Etching |
| Discrete metal layer fragment-including opening (A1) | Yes | Yes | Yes | No | No | No | No | No |
| Number of openings | 427 | 410 | 397 | 44 | 15 | 402 | 431 | 385 |
| Percentage of number of discrete metal layer fragment-including openings (A1), based on number of openings (%) | 5.0 | 8.0 | 15.0 | — | — | — | — | — |
| Opening rate (%) | 7.5 | 7.2 | 7.3 | 7.4 | 1.4 | 6.9 | 7.2 | 7.4 |
| Water vapor transmission rate ($g/m^2 \cdot 24$ hr) | 272 | 263 | 42 | 218 | 19.9 | 327 | 398 | 13.2 |
| Evaluation of interlayer peeling | Good | Good | Good | Good | Poor | Excellent | Good | Poor |
| Evaluation of electromagnetic wave-shielding characteristics (1 GHz) (dB) | 76 | 76 | 76 | 86 | 84 | 76 | 76 | 76 |
| Evaluation of electromagnetic wave-shielding characteristics (10 GHz) (dB) | 79 | 79 | 80 | 76 | 93 | 64 | 65 | 80 |
| Evaluation of resistance against folding | Good | Good | Good | Poor | Good | Poor | Poor | Good |

(Measurement of Water Vapor Transmission Rate)

On each of the electromagnetic wave shielding films according to Examples and Comparative Examples, the water vapor transmission rate was measured by the differential pressure method (in accordance with JIS K 7129). The measurement conditions were a temperature of 80° C., a humidity of 95% RH, and a differential pressure of 1 atm. Results were shown in Table 1.

(Evaluation of Interlayer Peeling)

Each of the electromagnetic wave shielding films according to Examples and Comparative Examples was disposed on a printed circuit board by heat-pressing. Then, the resulting printed circuit board was allowed to stand for 7 days in a clean room at 23° C. and a humidity of 63% RH, and then exposed to a temperature condition of reflow, and whether interlayer peeling was caused was evaluated. For the temperature condition of reflow, a temperature profile with a maximum of 265° C. was set on the assumption that lead-free solder was used. To evaluate whether interlayer peeling was caused, the printed circuit board with the shielding films adhered thereto was allowed to pass an IR reflow system five times, and it was visually observed whether any blister was caused. When no blister was caused on the shielding film, it was rated as "Excellent"; when a blister or blisters was/were caused on only a part of the shielding film, it was rated as "Good"; and when awful blisters were caused on the whole surface of the shielding film, it was rated as "Poor." Results were shown in Table 1.

(Evaluation of Electromagnetic Wave-Shielding Characteristics)

For electromagnetic wave shielding characteristics of each of the electromagnetic wave shielding films according to Examples and Comparative Examples, shielding characteristics at 1 GHz was evaluated by the KEC method involving use of a determination device for the electromagnetic wave shielding effect that had been developed by KEC Electronic Industry Development Center, and shielding characteristics at 10 GHz was determined by the coaxial tube method.

The KEC method will be described first.

Figure 3:
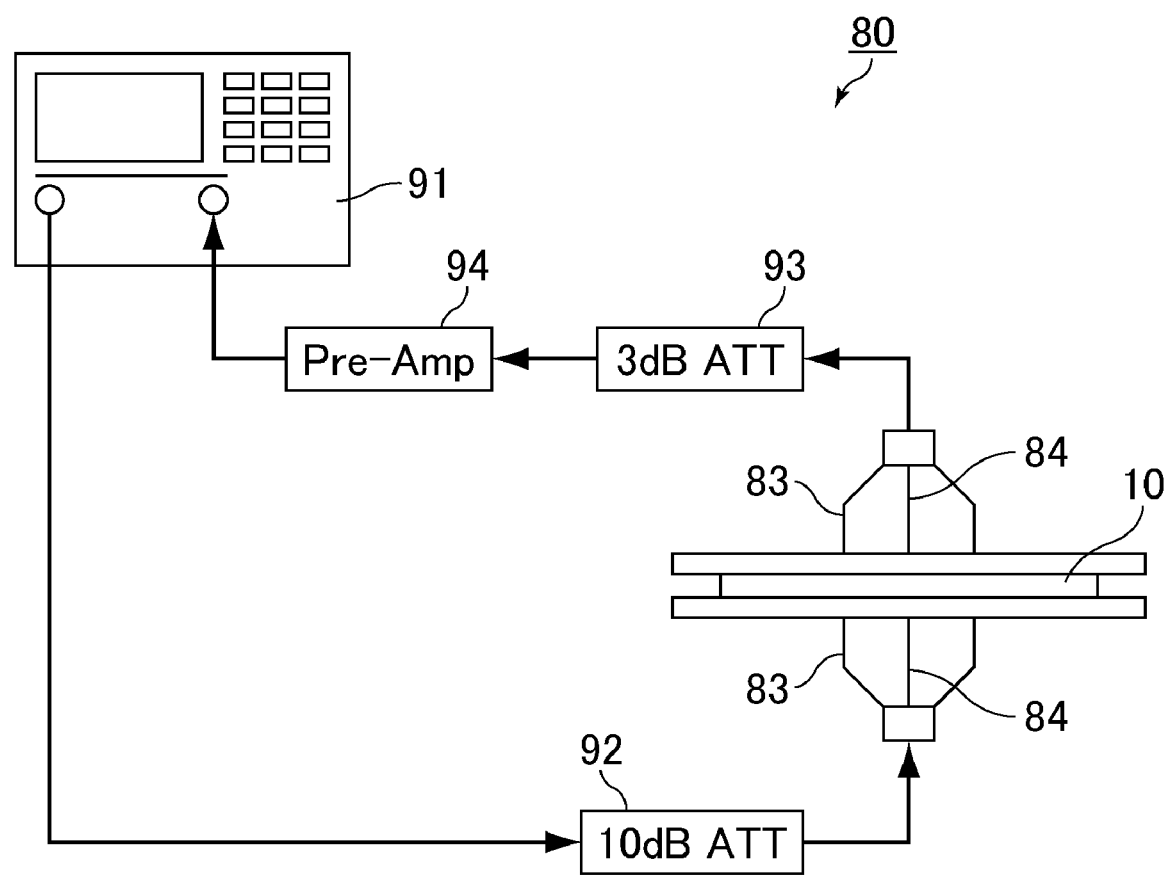
FIG. 3 is a schematic view schematically showing the configuration of the system used in the KEC method.

FIG. 3 is a schematic view schematically showing the configuration of a system used in the KEC method.

The system used in the KEC method is composed of: a determination device for the electromagnetic wave shielding effect 80; a spectrum analyzer 91; an attenuator 92 for an attenuation of 10 dB; an attenuator 93 for an attenuation of 3 dB; and a preamplifier 94.

As shown in FIG. 3, two measurement jigs 83 are provided to face each other in the determination device for the electromagnetic wave shielding effect, 80. Each of the electromagnetic wave shielding films according to Examples and Comparative Examples (designated by reference sign 10, in FIG. 3) is set so as to sandwich between the measurement jigs 83. The size of a TEM cell (Transverse Electro Magnetic Cell) is adopted to the measurement jigs 83, and the measurement jigs 83 has a structure that is bilaterally symmetrically divided by the plane perpendicular to the transmission axis thereof. In order to prevent the formation of a short circuit due to the insertion of the electromagnetic wave shielding film 10, a plate-like center conductor 84 is disposed so that a gap is left between the plate-like center conductor 84 and the measurement jig 83.

In the KEC method, a signal output from the spectrum analyzer 91 is input to the measurement jig 83 on the transmitting side via the attenuator 92. Then, the signal received by the measurement jig 83 on the receiving side and passing through the attenuator 93 is amplified by the preamplifier 94, and then, the signal level is determined by the spectrum analyzer 91. The spectrum analyzer 91 outputs the attenuation when the electromagnetic wave shielding film 10 was set on the determination device for the electromagnetic wave shielding effect, 80, with reference to that in the state in which no the electromagnetic wave shielding film 10 was set on the determination device for the electromagnetic wave shielding effect, 80.

The coaxial tube method will be described next.

In the coaxial tube method, the attenuation of the electromagnetic wave at 10 GHz caused by the electromagnetic wave shielding films according to Examples and Comparative Examples was determined using a coaxial tube-type system for determining the electromagnetic wave shielding effect, manufactured by KEYCOM Corp. under the conditions of a temperature of 25° C. and a relative humidity of 30 to 50%, in accordance with ASTM D4935.

Each of the electromagnetic wave shielding films according to Examples and Comparative Examples were cut into a 15 cm square, and the electromagnetic wave shielding characteristics were determined at 1 GHz or 10 GHz under the conditions of a temperature of 25° C. and a relative humidity of 30 to 50% using such a device, and evaluated.

The evaluation scale was as follows. Results are shown in Table 1.

(Evaluation of Resistance Against Folding)

The electromagnetic wave shielding films according to Examples and Comparative Examples were evaluated in the following manner.

Two sheets of the electromagnetic wave shielding films were heat-pressed to be adhered to the respective surfaces of a polyimide film having a thickness of 50 µm, and the resultant was cut into a sample having a size of length× width=130 mm×15 mm. The resistance against folding of the sample was determined using a MIT folding fatigue resistance tester (No. 307 MIT Type Folding Endurance Tester, manufactured by YASUDA SEIKI SEISAKUSHO, LTD.) by the method defined in JIS P 8115: 2001.

The test conditions were as follows.

Top of the folding clamp, R: 0.38 mm
Folding angle: ±1350
Folding speed: 175 cpm
Weight load: 500 gf
Detection method: sensing disconnection in the shielding film by a built-in conducting unit The evaluation scale for the resistance against folding was as follows. Results are shown in Table 1.

Good: no disconnection was caused even when the sample was folded 2500 times.

Poor: disconnection was caused when the sample was folded less than 2500 times.

As shown in Table 1, it was found that the electromagnetic wave shielding film according to each Example had both permeability to volatile components and shielding characteristics and also having sufficiently high resistance against folding.

REFERENCE SIGNS LIST 1 shielded printed circuit board
10 electromagnetic wave shielding film
20 insulating layer
30 metal layer
31 island-shaped metal layer fragment
40 adhesive layer
50 opening
51 opening (A) including one or more island-shaped metal
50 layer fragments
51a opening (A1) including one or more island-shaped metal layer fragments
51b opening (A2) including one or more island-shaped metal layer fragments
51c opening (A3) including one or more island-shaped metal layer fragments
55 island-shaped metal layer fragment-free opening
60 printed circuit board
61 base member
62 printed circuit
63 insulating film
80 determination device for the electromagnetic wave shielding effect
83 measurement jig
84 center conductor
91 spectrum analyzer
92, 93 attenuator
94 preamplifier

The invention claimed is:

1. An electromagnetic wave shielding film comprising:
an adhesive layer;
a metal layer made of a metal and placed on the adhesive layer; and
an insulating layer placed on the metal layer,
wherein a plurality of openings are formed in the metal layer;
the openings include openings (A) including one or more island-shaped metal layer fragments, each opening (A) having one or more island-shaped metal layer fragments formed therein, and
the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside a contour of the opening (A).

2. The electromagnetic wave shielding film according to claim 1, wherein a percentage of the number of the openings (A) including one or more island-shaped metal layer fragments is 25% or more based on the number of the openings.

3. The electromagnetic wave shielding film according to claim 1, wherein a percentage of the number of the openings (A1) including one or more island-shaped metal layer fragments is 5% or more based on the number of the openings.

4. The electromagnetic wave shielding film according to claim 1, wherein the metal layer has an opening rate of 5 to 90%.

5. The electromagnetic wave shielding film according to claim 1, wherein an average area inside the contour of one of the openings is 5 to 2000 µm$^2$.

6. The electromagnetic wave shielding film according to claim 1, wherein the metal layer has a thickness of 0.4 to 1.9 µm$^2$.

7. The electromagnetic wave shielding film according to claim 1, wherein the metal layer comprises at least one metal selected from the group consisting of copper, silver, gold, aluminum, nickel, tin, palladium, chromium, titanium, or zinc.

8. The electromagnetic wave shielding film according to claim 1, wherein the electromagnetic wave shielding film has a water vapor transmission rate of 40 g or more per m$^2$·24 h at a temperature of 80° C., a humidity of 95% RH, and a differential pressure of 1 atm, in accordance with JISK7129.

9. A shielded printed circuit board, comprising:
a printed circuit board comprising a base member having a printed circuit and an insulating film provided on the base member to cover the printed circuit; and
an electromagnetic wave shielding film provided on the printed circuit board,
wherein the electromagnetic wave shielding film is the electromagnetic wave shielding film according to claim 1.

10. An electromagnetic wave shielding film comprising:
an adhesive layer;
a metal layer made of a metal and placed on the adhesive layer; and
an insulating layer placed on the metal layer,
wherein a plurality of openings are formed in the metal layer;

the openings include openings (A) including one or more island-shaped metal layer fragments, each opening (A) having one or more island-shaped metal layer fragments formed therein, and a total of areas of the one or more island-shaped metal layer fragments in the whole metal layer accounts for 1 to 90% of a total of areas inside contours of the openings in the whole metal layer.

11. The electromagnetic wave shielding film according to claim 10, wherein the openings (A) including one or more island-shaped metal layer fragments include openings (A1) including one or more island-shaped metal layer fragments, each opening (A1) defining an opening (A) including one or more island-shaped metal layer fragments in which a total area of the one or more island-shaped metal layer fragments accounts for 40 to 80% of an area inside a contour of the opening (A).

12. The electromagnetic wave shielding film according to claim 11, wherein a percentage of the number of the openings (A1) including one or more island-shaped metal layer fragments is 5% or more based on the number of the openings.

13. The electromagnetic wave shielding film according to claim 10, wherein a percentage of the number of the openings (A) including one or more island-shaped metal layer fragments is 25% or more based on the number of the openings.

14. A shielded printed circuit board, comprising:
a printed circuit board comprising a base member having a printed circuit and an insulating film provided on the base member to cover the printed circuit; and
an electromagnetic wave shielding film provided on the printed circuit board,
wherein the electromagnetic wave shielding film is the electromagnetic wave shielding film according to claim 10.

* * * * *